(12) United States Patent
Cheng et al.

(10) Patent No.: US 9,401,334 B1
(45) Date of Patent: Jul. 26, 2016

(54) PREVENTING UNAUTHORIZED USE OF INTEGRATED CIRCUITS FOR RADIATION-HARD APPLICATIONS

(71) Applicant: International Business Machines Corporation, Armonk, NY (US)

(72) Inventors: Kangguo Cheng, Schenectady, NY (US); Bruce B. Doris, Slingerlands, NY (US); Ali Khakifirooz, Los Altos, CA (US); Kenneth P. Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/657,682

(22) Filed: Mar. 13, 2015

(51) Int. Cl.
| H01L 23/552 | (2006.01) |
| H01L 23/00 | (2006.01) |
| H01L 29/78 | (2006.01) |
| H01L 29/06 | (2006.01) |
| H01L 27/12 | (2006.01) |
| H01L 21/84 | (2006.01) |

(52) U.S. Cl.
CPC .............. *H01L 23/576* (2013.01); *H01L 21/84* (2013.01); *H01L 27/1203* (2013.01); *H01L 29/0649* (2013.01); *H01L 29/7838* (2013.01)

(58) Field of Classification Search
CPC .............. H01L 23/576; H01L 27/1203; H01L 29/0649
See application file for complete search history.

(56) References Cited

U.S. PATENT DOCUMENTS

| 4,996,576 | A | 2/1991 | Lynch et al. |
| 6,268,630 | B1 | 7/2001 | Schwank et al. |
| 6,492,209 | B1 | 12/2002 | Krishnan et al. |
| 6,818,496 | B2 | 11/2004 | Dennison et al. |
| 6,867,433 | B2 * | 3/2005 | Yeo ......................... H01L 21/84 257/350 |
| 6,909,159 | B2 | 6/2005 | Friend et al. |
| 7,301,206 | B2 | 11/2007 | Yeo et al. |
| 7,355,249 | B2 | 4/2008 | Clark, Jr. et al. |

(Continued)

OTHER PUBLICATIONS

Gaillardin et al., "Investigations on the Vulnerability of Advanced CMOS Technologies to MGy Dose Environments", IEEE Transactions on Nuclear Science, vol. 60, No. 4, Aug. 2013, pp. 2590-2597.

(Continued)

*Primary Examiner* — Jeffrey Zweizig
(74) *Attorney, Agent, or Firm* — Scully, Scott, Murphy & Presser, P.C.; Louis J. Percello, Esq.

(57) ABSTRACT

An integrated circuit, a method of forming an integrated circuit, and a semiconductor are disclosed for preventing unauthorized use in radiation-hard applications. In one embodiment, the integrated circuit comprises a silicon-on-insulator (SOI) structure, a radiation insensitive sub-circuit, and a radiation sensitive sub-circuit. The SOI structure comprises a silicon substrate, a buried oxide layer, and an active silicon layer. The radiation insensitive sub-circuit is formed on the active layer, and includes a partially depleted transistor. The radiation sensitive sub-circuit is formed on the active layer, and includes a fully depleted transistor, to prevent operation of the radiation sensitive sub-circuit under specified radiation conditions. Each of the partially depleted transistor and the fully depleted transistor includes a channel region formed in the active silicon layer, and the channel regions of the partially depleted transistor and the fully depleted transistor have substantially the same thickness but different doping concentrations.

19 Claims, 6 Drawing Sheets

(56) References Cited

U.S. PATENT DOCUMENTS

| | | | |
|---|---|---|---|
| 7,410,841 B2* | 8/2008 | Tigelaar | H01L 27/1203 257/E21.703 |
| 7,521,760 B2* | 4/2009 | Joshi | H01L 21/84 257/1 |
| 7,880,340 B2 | 2/2011 | Miller | |
| 8,647,909 B2 | 2/2014 | Cannon et al. | |
| 2006/0216898 A1 | 9/2006 | Tigelaar | |

OTHER PUBLICATIONS

Cauchy et al., "Questions and Answers on Fully Depleted SOI Technology for next generation CMOS nodes", SOI Industry Consortium, www.soiconsortium.org, Apr. 2010, pp. 1-17.

* cited by examiner

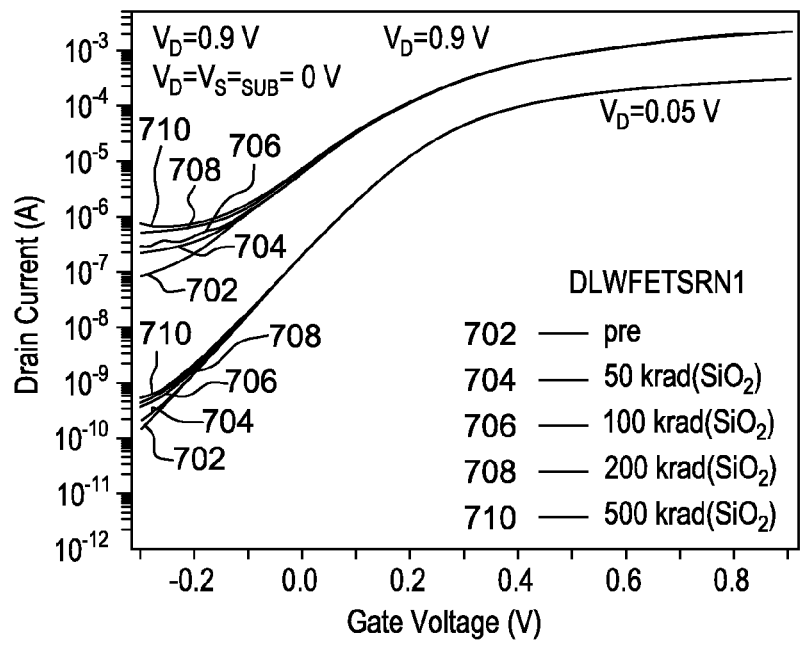
PDSOI
Not sensitive    FIG. 7
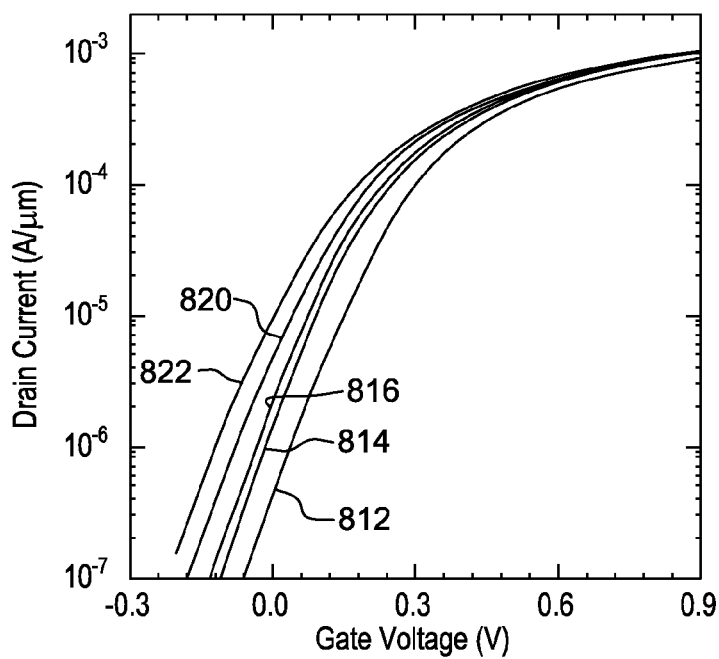
ETSOI
Sensitive    FIG. 8

PREVENTING UNAUTHORIZED USE OF INTEGRATED CIRCUITS FOR RADIATION-HARD APPLICATIONS

BACKGROUND

This invention generally relates to semiconductor devices, and more specifically to preventing unauthorized use of integrated circuits for radiation-hard applications. Even more particularly, embodiments of the invention relate to preventing such unauthorized use of integrated circuits formed using a silicon-on-insulator technology.

Silicon-on-insulator (SOI) technology refers to the use of a layered silicon-insulator-silicon substrate in place of conventional silicon substrates in semiconductor manufacturing to reduce parasitic device capacitance, thereby improving performance. SOI based devices are an improvement on the earlier bulk Si metal oxide semiconductor (CMOS) technology.

SOI based devices differ from earlier bulk silicon-built devices in that the thin silicon junction is above an electrical insulator such as silicon dioxide.

SOI technology is one of a number of manufacturing improvements that enable the continued miniaturization of microelectronic devices. SOI substrates may be fabricated in ways that are compatible with many standard semiconductor manufacturing methods. SOI based devices may be fabricated without special equipment or substantial re-tooling of existing semiconductor manufacturing equipment.

One advantage of SOI based devices is that they are much less susceptible to errors induced by radiation than are bulk Si CMOS based devices. These errors are often typically referred to as soft errors.

Partially depleted SOI (PDSOI) circuits are significantly immune to soft errors. In the past, PDSOI MOSFETs were sensitive to total ionizing dose (TID) effects. However, with the relatively high doping density used in the channels of PDSOI devices, for example on 45 and 32 nm node, these device are almost completely insensitive to TID.

Although reducing the likelihood of soft errors is, in general, an advantage, there are disadvantages of or restrictions on products with a high resistance to radiation. For example, there are government restrictions on the sale and export of semiconductor circuits having radiation resistance characteristics that meet or exceed specified levels. Such semiconductor products are referred to as radiation-hardened.

It is possible to use a circuit fabricated in an advanced commercial PDSOI technology in radiation-hard applications. So, there is a need for a method and system to prevent potential unauthorized use.

SUMMARY

Embodiments of the invention provide an integrated circuit, a method of forming an integrated circuit, and a semiconductor for preventing unauthorized use in radiation-hard applications. In one embodiment, the integrated circuit comprises a silicon-on-insulator (SOI) structure, a radiation insensitive sub-circuit, and a radiation sensitive sub-circuit. The SOI structure comprises a silicon substrate, a buried oxide layer on the silicon substrate, and an active silicon layer on the buried oxide layer. The radiation insensitive sub-circuit is formed on the active layer, and includes a partially depleted transistor. The radiation sensitive sub-circuit is formed on the active layer, and includes a fully depleted transistor, to prevent operation of the radiation sensitive sub-circuit under specified radiation conditions. Each of the partially depleted transistors and the fully depleted transistor includes a channel region formed in the active silicon layer, and the channel regions of the partially depleted transistor and the fully depleted transistor have substantially the same thickness and different doping concentrations.

In one embodiment, the fully depleted transistor detects exposure of the radiation insensitive sub-circuit to given radiation conditions.

In another embodiment, the radiation insensitive sub-circuit monitors the threshold voltage of the radiation sensitive sub-circuit.

In an embodiment, when changes to a threshold voltage of the radiation sensitive sub-circuit are higher than a given threshold, the radiation sensitive sub-circuit disables the radiation insensitive sub-circuit.

In one embodiment, when changes to the threshold voltage of the radiation sensitive sub-circuit are higher than the given threshold, the radiation sensitive sub-circuit generates a disable signal and applies the disable signal to the radiation insensitive sub-circuit to disable the radiation insensitive sub-circuit.

In an embodiment, the integrated circuit further comprises a controller for selectively disabling the radiation insensitive sub-circuit. In this embodiment, the fully depleted transistor applies a signal to the controller, and the controller receives this signal and processes the signal according to a given process to disable the radiation insensitive sub-circuit under defined conditions.

In an embodiment, the integrated circuit further comprises a further partially depleted transistor for applying a signal to the controller. The controller processes the signal from the fully depleted transistor and the further signal from the further partially depleted transistor according to the given process to disable the radiation insensitive sub-circuit under the defined conditions.

In one embodiment, the radiation sensitive sub-circuit functions as a switch in the radiation insensitive sub-circuit.

In an embodiment, the radiation sensitive sub-circuit has an open state to disable the radiation insensitive sub-circuit, and the radiation sensitive sub-circuit is in the open state when a threshold voltage of the radiation sensitive sub-circuit is above a given threshold value.

In one embodiment, the fully depleted transistor and the partially depleted transistor have substantially identical structures including the channel regions, source regions, drain regions, and gates.

In an embodiment, the invention provides a method of fabricating an integrated circuit on a silicon-on-insulator (SOI) structure. The SOI structure comprises a silicon substrate, a buried oxide layer on the silicon substrate, and a silicon layer on the buried oxide layer. In one embodiment, the method comprises forming a radiation insensitive sub-circuit and a radiation sensitive sub-circuit on the silicon layer. The radiation insensitive sub-circuit includes a partially depleted transistor, and the radiation sensitive sub-circuit includes a fully depleted transistor. Each of the partially depleted transistor and the fully depleted transistor includes a channel region formed in the silicon layer, and the channel regions of the partially depleted transistor and the fully depleted transistor have substantially the same thickness and different doping concentrations.

In an embodiment, when changes to a threshold voltage of the radiation sensitive sub-circuit are higher than a given threshold, the radiation sensitive sub-circuit disables the radiation insensitive sub-circuit.

In one embodiment, a radiation sensitive sub-circuit includes forming the radiation sensitive sub-circuit inside the radiation insensitive sub-circuit.

In an embodiment, the radiation sensitive sub-circuit functions as a switch for the radiation insensitive sub-circuit and has an open state to disable the radiation insensitive sub-circuit. In this embodiment, the radiation sensitive sub-circuit is in the open state when a threshold voltage of the radiation sensitive sub-circuit is above a given threshold value.

In one embodiment, the fully depleted transistor and the partially depleted transistor have substantially identical structures including the channel regions, source regions, drain regions, and gates.

In embodiments of the invention, FDSOI devices are inserted into the PDSOI technology by either keeping their well undoped or lightly doped. FDSOI transistors are sensitive to TID and can be used to detect exposure to ionizing radiation. In one embodiment, one or more FDSOI transistors can be monitored for changes in their threshold voltage, or off current, and if these changes are higher than a given threshold, the rest of the integrated circuit is disabled. In another embodiment, a small portion of the circuit is designed with FDSOI transistors so that this portion of the circuit—and thus the whole circuit—fails when exposed to radiation.

BRIEF DESCRIPTION OF THE SEVERAL VIEWS OF THE DRAWINGS

FIG. 7 is a graph showing drain current vs. gate voltage for PDSOI devices at two different biases as a function of x-ray radiation fluence.

FIG. 8 is a graph showing drain current vs. gate voltage for ETSOI sensitive devices, showing that the entire curve shifts (Vt shift) as a function of radiation dose.

DETAILED DESCRIPTION

Figure 1:
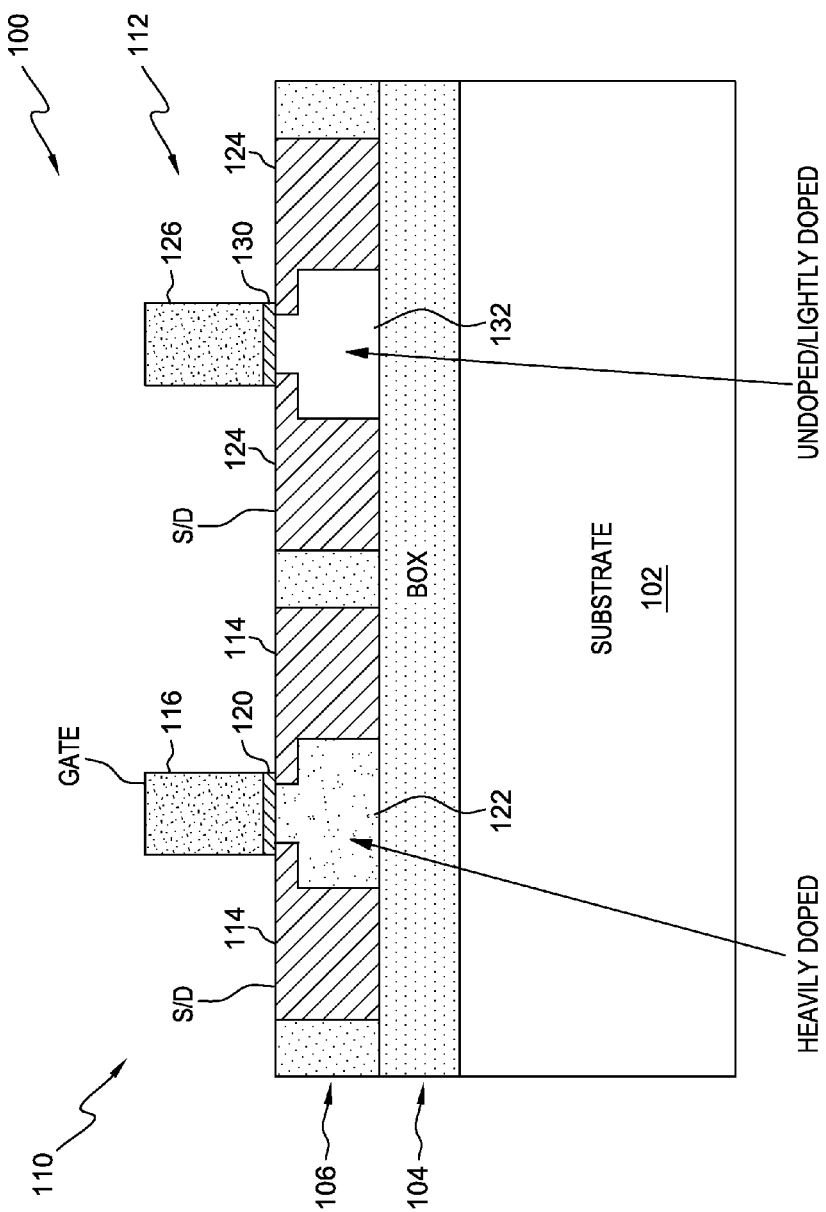
FIG. 1 is a schematic illustration of an SOI structure in accordance with one aspect of the present invention.

This invention relates to an integrated circuit formed in an SOI structure and designed to prevent unauthorized use of the integrated circuit in radiation-hard applications.

The present invention will now be described with reference to the drawings, wherein like reference numerals are used to refer to like elements throughout. It should be understood that the description of the disclosed embodiments is merely illustrative.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced with a wide range of specific details. In other instances, well-known structures or processing steps have not been described in detail in order to avoid obscuring the invention.

FIG. 1 shows a silicon-on-insulator (SOI) structure 100 having a substrate 102, a buried insulator layer 104 formed over substrate 102, and an active layer 106 formed over buried insulator layer 104. A plurality of transistors 110, 112 are formed in the active layer.

Transistor 110 includes source and drain regions 114, gate 116, gate dielectric 120 and channel 122. Similarly, transistor 112 includes source and drain regions 124, gate 126, gate dielectric 130 and channel 132. Channel 122 of transistor 110 is heavily doped, and transistor 110 is a partially depleted (PD SOI) device. Channel 132 of transistor 112 is undoped or lightly doped, and transistor 112 is a fully depleted (FD SOI) device.

The base semiconductor substrate layer 102 may comprise any suitable semiconductor material including, but not limited to: Si, SiC, SiGe, SiGeC, Ge alloys, GaAs, InAs, InP, other III-V or II-VI compound semiconductors, or organic semiconductor structures. In some embodiments of the present invention, it may be preferred that the base semiconductor substrate layer 102 be composed of a Si-containing semiconductor material, i.e., a semiconductor material that includes silicon. Further, the base semiconductor substrate layer 102 may be doped or contain both doped and undoped regions. Although the base semiconductor substrate layer 102 may be a bulk semiconductor structure, it may also include a layered structure with one or more buried insulator layers (not shown).

The buried insulator layer 104 may comprise any suitable insulator material(s), and it typically comprises an oxide, a nitride, or an oxynitride in either a crystalline phase or a non-crystalline phase. The buried insulator layer 104 may be a homogenous, continuous layer, or it may contain relatively large cavities or micro- or nano-sized pores (not shown). Physical thickness of the buried insulator layer 104 may vary widely depending on the specific application, but it typically ranges from about 10 nm to about 500 nm, with from about 20 nm to about 150 nm being more typical.

The semiconductor device layer 106 may comprise any semiconductor material including, but not limited to: Si, SiC, SiGe, SiGeC, Ge alloys, GaAs, InAs, InP, other III-V or II-VI compound semiconductors, or organic semiconductor structures. In some embodiments of the present invention, it may be preferred that the semiconductor device layer 106 be composed of a Si-containing semiconductor material, i.e., a semiconductor material that includes silicon. Further, the semiconductor device layer 106 may be doped or contain both doped and undoped regions therein. Physical thickness of the semiconductor device layer 106 may vary widely depending on the specific application, but it typically ranges from about 10 nm to about 200 nm, with from about 20 nm to about 100 nm being more typical.

As mentioned above, transistor 110 includes source and drain regions 114 formed in active layer 106, gate 116, gate dielectric 120 and channel 122. Similarly, transistor 112 comprises source and drain regions 124 formed in active layer 106, gate 126, gate dielectric 130 and channel 132.

With both transistors 110 and 112, the gate electrode of the transistor is located above the semiconductor device layer 106, and the gate insulator 120 or 130 is located in between. The gate insulator may be, for example, an oxide layer grown on a surface of the substrate; and the gate electrode is deposited on the gate insulator and may be comprised of a conducting material such as a metal, metal alloy or polysilicon.

As one example, the gate insulator layers 120, 130 may comprise thermally grown or deposited silicon dioxide that is nitridized by plasma or thermal nitridation and having a thickness of about 1 nm or more. As a second example, layers 120, 130 may be a high-K (dielectric constant from about 7 to about 30 or higher) material, examples of which include but are not limited to silicon nitride, metal silicates such as $HfSi_xO_y$ and $HfSi_xO_yN_z$, metal oxides such as $Al_2O_3$, $HfO_2$, $ZrO_2$, $Ta_2O_5$, and $BaTiO_3$, and combinations of layers thereof.

The gate electrode of each transistor 110, 112 may be formed on a top surface of the gate dielectric layer of the transistor. Gate electrode 116, 126 may, for example, be formed by deposition of a polysilicon layer, followed by photolithography or electron-beam lithography to define the gate shape and then an RIE process to remove excess polysilicon. The gate electrode may be intrinsic (undoped) polysilicon or lightly-doped (not greater than about $1E15$ atoms/$cm^3$ to about $1E16$ atoms/$cm^3$) P or N type Si.

Channel 122 of transistor 110 is heavily doped so that the transistor is a partially depleted device, and channel 132 of transistor 112 is undoped or lightly doped so that this transistor is a fully depleted device.

In a partially depleted transistor, the body thickness of the transistor is thicker than the maximum depletion layer width in the silicon during device operation. In a fully-depleted transistor, the body thickness of the transistor is thinner than the maximum depletion layer width in the silicon during device operation.

It will be appreciated that while two active regions are depicted in FIG. 1, any suitable number of such areas can be formed. In particular, while in the example presented, one FDSOI transistor and one PDSOI are illustrated, any suitable number of FDSOI and PDSOI transistors can be formed in the active regions of structure 100.

As mentioned above, embodiments of the invention are designed to prevent unauthorized use of the integrated circuit in radiation-hard applications. In embodiments of the invention, FDSOI devices are inserted in the PDSOI technology by either keeping their well undoped or lightly doped. FDSOI transistors are sensitive to TID and can be used to detect exposure to radiation. In one embodiment, one or more FDSOI transistors can be monitored for changes in threshold voltage or off current and if these changes are higher than a given threshold, the rest of the integrated circuit is disabled. In another embodiment, a small portion of the circuit is designed with FDSOI transistors so that this portion of the circuit—and thus the whole circuit—fails when exposed to radiation.

FIGS. 2-6 show specific applications of embodiments of the invention.

Figure 2:
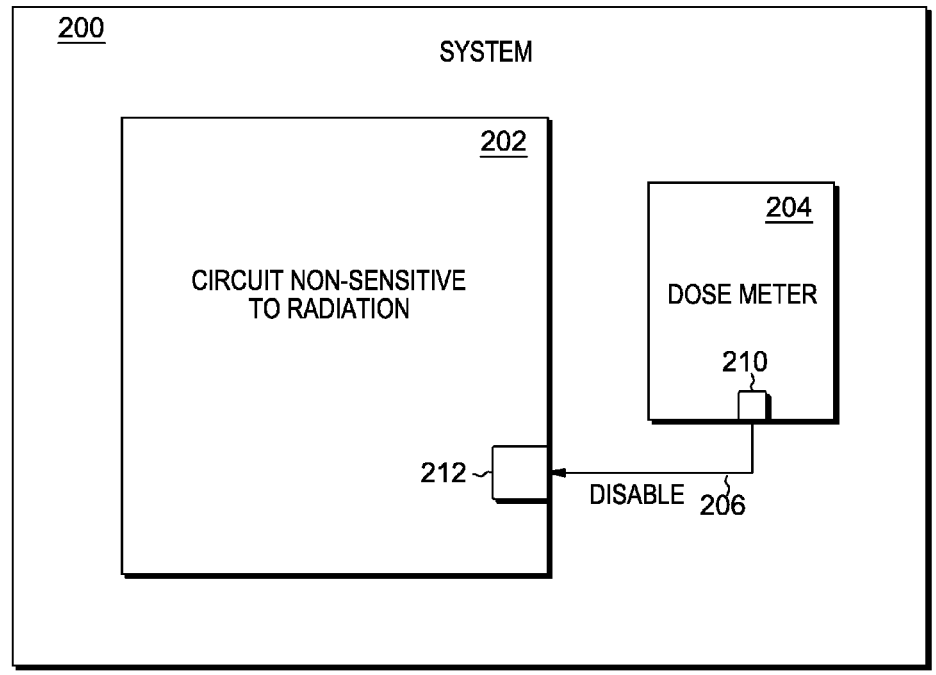
FIG. 2 shows an electronic system including a radiation dose meter in accordance with an embodiment of the invention.

In the application shown in FIG. 2, the FDSOI devices are used to meter the radiation received by an electronic system 200 and to disable operation of a circuit that is not sensitive to radiation. More specifically, in this embodiment, electronic system 200 includes a circuit 202 that is not-sensitive to radiation, and a dose meter 204 including one or more FDSOIs constructed in accordance with an embodiment of this invention. When the total ionizing dose received by dose meter 204 rises above a preset level, the dose meter generates a disable signal 206. This disable signal is applied to circuit 202, disabling all or part of that circuit, preventing the use of the circuit 202 in this high radiation environment.

In an embodiment, dose meter 204 includes a disable signal generation circuit 210, which provides the disable signal 206 to a disabling mechanism 212 of circuit 202. When a radiation threshold is determined by the dose meter 204, the dose meter sends the disable signal to the disabling mechanism. The disabling mechanism 212 may include a circuit that can disable (or enable) circuitry for shutting down at least a portion of the circuit 202.

The type of radiation that the dose meter 204 is sensitive to may be adjusted based on the design of the devices and the circuitry employed. In one embodiment, circuitry of the dose meter may be configured to be sensitive to x-rays. This is particularly useful in medical applications where a computer system and a medical device may be co-located in an operating environment where computed tomography or fluoroscopy devices are in use, for example.

In other embodiments, the does meter 204 may be configured to be sensitive to cosmic radiation or other atomic radiation or radioactive decay. The system 200 in such cases may include computer devices or electronic systems in airplanes, space vehicles, nuclear power plants, nuclear vessels, etc.

Figure 3:
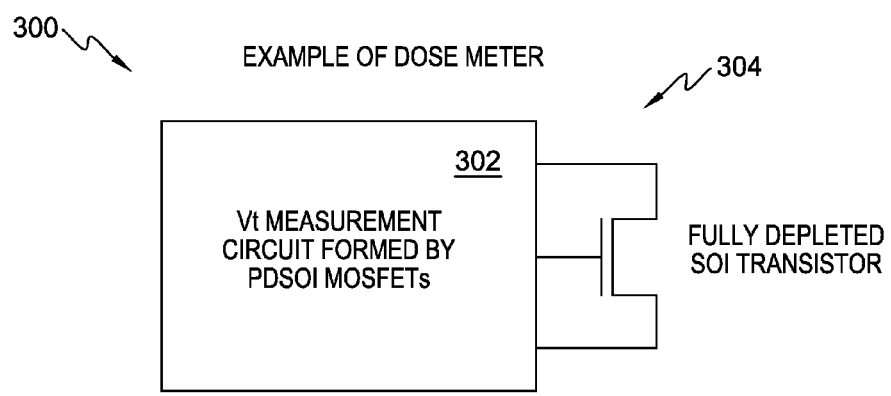
FIG. 3 depicts a dose meter that may be used in the system of FIG. 2.

FIG. 3 shows an example of a dose meter 300 that may be used in system 200 of FIG. 2. This dose meter includes a Vt measurement circuit 302 formed by PDSOI MOSFETS, and a fully depleted SOI transistor 304.

The fully depleted transistor 304 is sensitive to radiation, and in particular, the threshold voltage (Vt) of the transistor varies as a function of the radiation being received by the transistor. Circuit 302 measures that threshold voltage, and when the threshold voltage exceeds a given threshold voltage, circuit 302 generates the above-mentioned disable signal.

Figure 4:
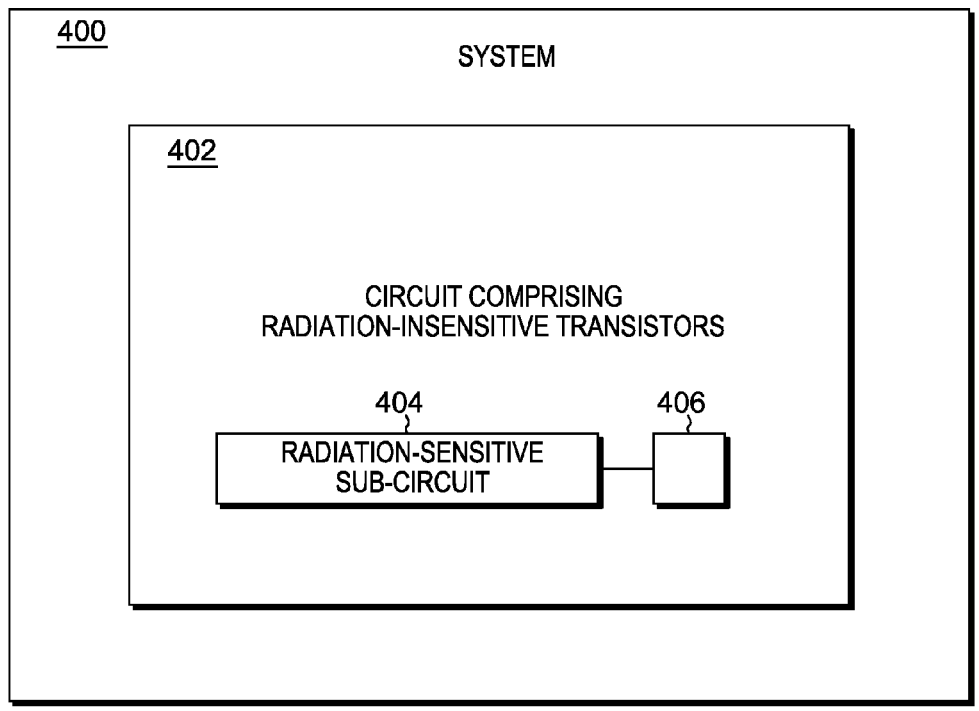
FIG. 4 illustrates a system including a radiation-sensitive sub-circuit in accordance with an embodiment of this invention.
Figure 5:
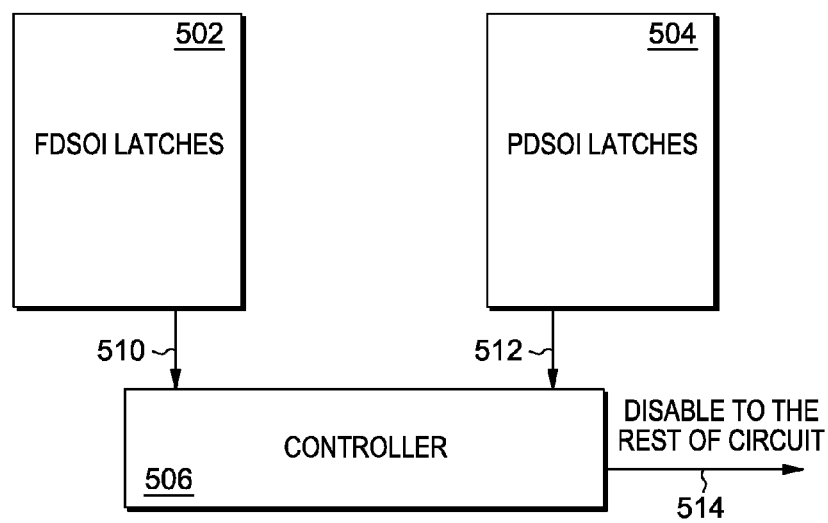
FIG. 5 shows an example of a radiation-sensitive sub-circuit that may be used in the system of FIG. 4.

FIGS. 4 and 5 illustrate an alternate embodiment. In this system 400, the radiation sensitive component is a sub-circuit of a larger circuit, rather than a separate circuit, as in the embodiment of FIGS. 2 and 3.

In this embodiment of FIGS. 4 and 5, electronic system 400 includes a circuit 402 which, in turn, includes sub-circuit 404. Circuit 402 includes radiation insensitive transistors, and sub-circuit 404 includes radiation sensitive FDSOI transistors. When the radiation received by sub-circuit 404 is more than a given threshold, sub-circuit 404 disables the rest of circuit 402. The disabling of the circuit 402 may be carried out using a disable circuit 406, which receives a disable signal from the sub-circuit 404.

FIG. 5 shows in greater detail a radiation sensitive sub-circuit 500 that may be used in the circuit 402 of FIG. 4. This sub-circuit 500 includes FDSOI latches 502, PDSOI latches 504, and controller 506. In this arrangement, the FDSOI latches—which are sensitive to radiation—apply one signal 510 to controller 506, and PDSOI latches—which are not sensitive to radiation—apply a second signal 512 to the controller. Controller 506 receives these two signals and, using these two signals, generates a disable signal 514 under specified conditions. This disable signal is applied to disable the rest of circuit 402 of FIG. 4. Any suitable programmed or programmable algorithm may be used by controller 506 to determine when to generate the disable signal.

The FDSOI circuits 502 may include latches, logic circuits, delay circuits or any other circuits that include FDSOI devices. Sub-circuit 500 may include components with PDSOI devices and circuits 504. The PDSOI circuits 504 may include latches, logic circuits, delay circuits or any other circuits that include PDSOI devices.

In one embodiment, similar circuit types and sizes are employed for both FDSOI circuits 502 and PDSOI circuits 504 so that a performance comparison can easily be made between operations between the two circuits 502 and 504.

Controller 506 may monitor the performance of the two circuits 502 and 504 to be able to determine a difference in performance between the circuits 504 with PDSOI devices and the circuits 502 with the FDSOI devices. In one embodiment, the circuits 504 with PDSOI devices and the circuits 502 with FDSOI devices are formed together on a single chip or substrate. In this way, the circuits share similar processing and similar structures to very accurately evaluate the different performance criteria between the circuits 502 and 504 by the controller 506. Once the performance criteria threshold is sensed between the circuits 502 and 504, a disable signal is generated to disable the circuit 402 or a portion of that circuit 402.

The controller 506 may rely on logic gates, signal speeds, slew rates, off current, threshold voltage changes or other criteria to sense radiation damage or exposure to the radiation sensitive circuit 502. Other electrical or electronic criteria may also be employed as would be understood by those skilled in the art.

Figure 6:
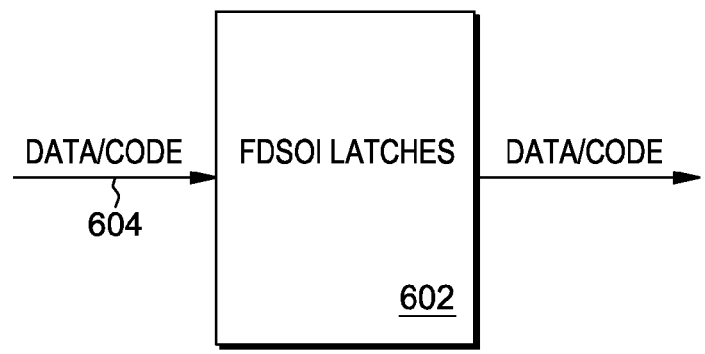
FIG. 6 illustrates an alternate radiation-sensitive sub-circuit that may be used in the system of FIG. 4.

FIG. 6 illustrates an alternate radiation sensitive sub-circuit 600. In this embodiment, data/code, of for example the circuit 402 of FIG. 4, is transmitted through a set of FDSOI latches 602. These latches are radiation sensitive. When the radiation received by the latches 602 is below a threshold level, the latches function as a closed switch and allow the data/code 604 to pass through the latches. When the radiation received by the latches 602 is above the threshold level, the latches function as an open switch and prevent the data/code 604 from passing through the latches.

FIGS. 7 and 8 illustrate differences between the operations of PDSOI transistors and ETSOI transistors. FIG. 7 shows the drain current as a function of the gate voltage for several PDSOI devices, and FIG. 8 shows the drain current as a function of gate voltage for several ETSOI devices. As the Figs. show, the drain currents of the ETSOI devices drop off significantly as the gate voltages falls below about 0.3 volts and the individual traces shift to higher Vg, making the device harder to turn on/off. In contrast, the individual traces in FIG. 7 do not shift at all with radiation exposure, except for minor (reversible) shifts at negative voltages.

Referring to FIG. 7, a graph of drain current (A) versus gate voltage (V) is shown for PDSOI transistors exposed to a plurality of radiation levels. The radiation levels include a no radiation line 702, a 50 krads radiation line 704 at the buried oxide layer (104 of FIG. 1), a 100 krads radiation line 706 at the buried oxide layer, a 200 krads radiation line 708 at the buried oxide layer, and a 500 krads radiation line 710 at the buried oxide layer. The plurality of radiation levels are shown for a device having a drain voltage ($V_d$) of 0.05 V and a drain voltage ($V_d$) of 0.9 V. Gate voltage, V, source voltage $V_s$, and $V_{sub}$ were all zero. As shown in FIG. 7, except for a small region at a gate voltage of −0.3 V, the drain current remained stable across the different radiation exposure rates. Therefore, the PDSOI devices are radiation hard and not sensitive to radiation exposure.

Referring to FIG. 8, a graph of drain current density (A/micron) versus gate voltage (V) is shown for FDSOI transistors exposed to a plurality of radiation levels. Each line 812, 814, 816, 820 and 822 represents a different exposure time/rate. With different radiation levels, the FDSOI devices show sensitivity in both drain current density and gate voltage.

Figure 9:
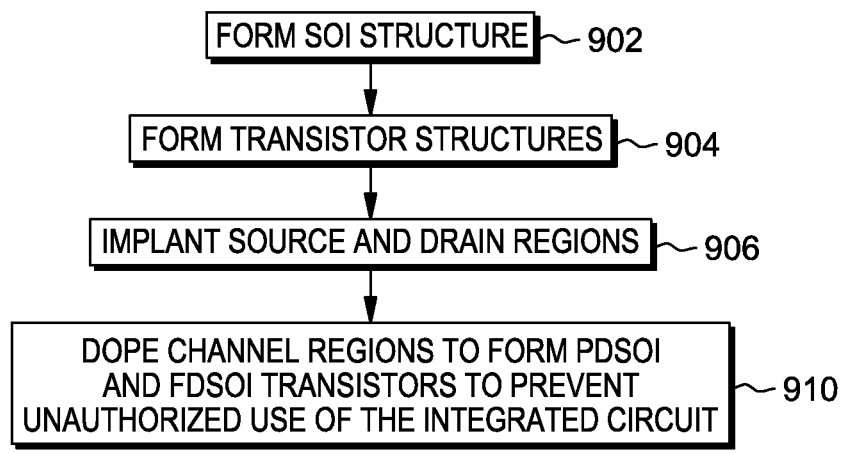
FIG. 9 illustrates a methodology for forming a radiation detector in silicon-on-insulator technology in accordance with an embodiment of this invention.

Aspects of the invention also include a method of forming a radiation detector in silicon-on-insulator technology. The method employs suitable techniques to generate the above-described structures. With particular reference to FIGS. 1 and 9, at 902, SOI structure 100 is formed, having buried insulator layer 104 over substrate 102 and active layer 106 formed over buried insulator layer 104.

Transistors 110 and 112 are formed at step 904. Transistor 110 is formed over active layer 106; and this transistor includes gate conductor 116, gate dielectric 130, and source/drain diffusion regions 114. Transistor 112 is also formed over active layer 106; and this transistor includes gate conductor 126, gate dielectric 120, and source/drain diffusion regions 124. As discussed below, active layer 106 has a doping profile such that transistor 110 is a partially-depleted transistor and transistor 112 is a fully-depleted transistor.

To establish any of the different transistors, a gate structure and source and drain regions are formed, after which silicide, metallization, and/or other back-end processing can be performed. To form the gate structure, a thin gate oxide may be formed over the upper surface of the silicon regions. The gate oxide can be formed by any suitable material formation process, such as thermal oxidation processing.

A gate layer is then deposited over the layer of gate oxide material. The gate layer may include a dopant such as a p-type dopant or an n-type dopant, depending on the type of transistor to be formed. The dopant can be in the gate layer material as originally applied, or may be subsequently added thereto. The gate oxide and gate layer are then patterned to form the gate structure.

At 906, implants to form the source and drain regions 114, 124 are then performed, and any suitable mask and implantation processes may be used in forming the source and drain regions to achieve the desired transistor types. The channel regions 122, 132 of the transistors are thus defined between the source and drain regions in the transistors. The channel regions, at 910, can be doped prior to forming the gate oxide to adjust the threshold voltages (Vts) of the transistors as desired.

It will be understood by those of ordinary skill in the art that while reference is made throughout this document to exemplary structures in discussing aspects of the methodologies described herein, those methodologies are not to be limited by the corresponding structures presented. It is also to be appreciated that layers and/or elements depicted herein are illustrated with particular dimensions relative to one another for purposes of explanation and ease of understanding, and that actual dimensions of the elements may differ substantially from that illustrated herein.

Although one or more aspects of the invention has been shown and described with respect to one or more implementations, equivalent alterations and modifications will occur to those skilled in the art based upon a reading and understanding of this specification and the accompanying drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application.

The invention claimed is:

1. An integrated circuit for preventing unauthorized use of the integrated circuit in radiation-hardened environments, the integrated circuit comprising:
   a silicon-on-insulator (SOI) structure comprising a silicon substrate, a buried oxide layer on the silicon substrate, and an active silicon layer on the buried oxide layer;
   a radiation insensitive sub-circuit formed on the active layer, and including a partially depleted transistor; and
   a radiation sensitive sub-circuit formed on the active layer, and including a fully depleted transistor, to prevent operation of the radiation insensitive sub-circuit under specified radiation conditions; and wherein:
   each of the partially depleted transistor and the fully depleted transistor includes a channel region formed in the active silicon layer, and the channel regions of the partially depleted transistor and the fully depleted transistor have substantially the same thickness and different doping concentrations.

2. The integrated circuit according to claim 1, wherein the fully depleted transistor detects exposure of the radiation insensitive sub-circuit to given radiation conditions.

3. The integrated circuit according to claim 1, wherein the radiation insensitive sub-circuit monitors a threshold voltage of the radiation sensitive sub-circuit.

4. The integrated circuit according to claim 1, wherein when changes to a threshold voltage of the radiation sensitive sub-circuit are higher than a given threshold, the radiation sensitive sub-circuit disables the radiation insensitive sub-circuit.

5. The integrated circuit according to claim 4, wherein when changes to the threshold voltage of the radiation sensitive sub-circuit are higher than the given threshold, the radiation sensitive sub-circuit generates a disable signal and applies the disable signal to the radiation insensitive sub-circuit to disable the radiation insensitive sub-circuit.

6. The integrated circuit according to claim 1, further comprising:
a controller for selectively disabling the radiation insensitive sub-circuit; and wherein:
the fully depleted transistor applies a signal to the controller; and
the controller receives the signal and processes said signal according to a given process to disable the radiation insensitive sub-circuit under defined conditions.

7. The integrated circuit according to claim 6, further comprising:
a further partially depleted transistor for applying a further signal to the controller; and
wherein the controller processes the signal from the fully depleted transistor and the further signal from the further partially depleted transistor according to the given process to disable the radiation insensitive sub-circuit under the defined conditions.

8. The integrated circuit according to claim 1, wherein the radiation sensitive sub-circuit functions as a switch in the radiation insensitive sub-circuit.

9. The integrated circuit according to claim 8, wherein:
the radiation sensitive sub-circuit has an open state to disable the radiation insensitive sub-circuit; and
the radiation sensitive sub-circuit is in the open state when a threshold voltage of the radiation sensitive sub-circuit is above a given threshold value.

10. The integrated circuit according to claim 1, wherein the fully depleted transistor and the partially depleted transistor have substantially identical structures including the channel regions, source regions, drain regions, and gates.

11. A method of fabricating an integrated circuit on a silicon-on-insulator (SOI) structure, the SOI structure comprising a silicon substrate, a buried oxide layer on the silicon substrate, and a silicon layer on the buried oxide layer, the method comprising:
forming a radiation insensitive sub-circuit on the silicon layer, the sub-circuit including a partially depleted transistor; and
forming a radiation sensitive sub-circuit on the silicon layer the radiation sensitive sub-circuit including a fully depleted transistor; and wherein:
each of the partially depleted transistor and the fully depleted transistor includes a channel region formed in the active silicon layer, and the channel regions of the partially depleted transistor and the fully depleted transistor have substantially the same thickness and different doping concentrations; and
when changes to a threshold voltage of the radiation sensitive sub-circuit are higher than a given threshold, the radiation sensitive sub-circuit disables the radiation insensitive sub-circuit.

12. The method according to claim 11, wherein the forming a radiation sensitive sub-circuit includes forming the radiation sensitive sub-circuit inside the radiation insensitive sub-circuit.

13. The method according to claim 12, wherein:
the radiation sensitive sub-circuit functions as a switch in the radiation insensitive sub-circuit and has an open state to disable the radiation insensitive sub-circuit; and
the radiation sensitive sub-circuit is in the open state when a threshold voltage of the radiation sensitive sub-circuit is above a given threshold value.

14. The method according to claim 11, wherein the fully depleted transistor and the partially depleted transistor have substantially identical structures including the channel regions, source regions, drain regions, and gates.

15. A semiconductor comprising:
a silicon-on-insulator (SOI) structure comprising a silicon substrate, a buried oxide layer on the silicon substrate, and an active silicon layer on the buried oxide layer;
an integrated circuit formed on the active layer; and
a radiation sensitive sub-circuit formed on the active layer; and wherein:
the integrated circuit includes at least one partially depleted transistor;
the radiation sensitive sub-circuit includes at least one fully depleted transistor to prevent selected operations of the integrated circuit under given radiation conditions; and
each of the partially depleted transistor and the fully depleted transistor includes a channel region formed in the active silicon layer, and the channel regions of the partially depleted transistor and the fully depleted transistor have substantially the same thickness and different doping concentrations.

16. The semiconductor according to claim 15, wherein the fully depleted transistor detects exposure of the integrated circuit to given radiation conditions.

17. The semiconductor according to claim 15, wherein when changes to a threshold voltage of the radiation sensitive sub-circuit are higher than a given threshold, the radiation sensitive sub-circuit disables at least portions of the integrated circuit.

18. The semiconductor according to claim 17, wherein when changes to the threshold voltage of the radiation sensitive sub-circuit are higher than the given threshold, the radiation sensitive sub-circuit generates a disable signal and applies the disable signal to the integrated circuit to disable the at least portions of the integrated circuit.

19. The semiconductor according to claim 15, wherein:
the radiation sensitive sub-circuit functions as a switch in the integrated circuit, and the radiation sensitive sub-circuit has an open state to disable the at least portions of the integrated circuit; and
the radiation sensitive sub-circuit is in the open state when a threshold voltage of the radiation sensitive sub-circuit is above a given threshold value.

* * * * *